US010700277B1

(12) United States Patent
Wang et al.

(10) Patent No.: US 10,700,277 B1
(45) Date of Patent: Jun. 30, 2020

(54) MEMORY DEVICE AND A METHOD FOR FORMING THE MEMORY DEVICE

(71) Applicant: GLOBALFOUNDRIES Singapore Pte. Ltd., Singapore (SG)

(72) Inventors: Lanxiang Wang, Singapore (SG); Shyue Seng Tan, Singapore (SG); Eng Huat Toh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/264,745

(22) Filed: Feb. 1, 2019

(51) Int. Cl.
*H01L 27/24* (2006.01)
*H01L 45/00* (2006.01)

(52) U.S. Cl.
CPC ...... *H01L 45/1273* (2013.01); *H01L 27/2463* (2013.01); *H01L 45/1675* (2013.01); *H01L 45/1233* (2013.01); *H01L 45/146* (2013.01)

(58) Field of Classification Search
None
See application file for complete search history.

(56) References Cited

U.S. PATENT DOCUMENTS

| | | | |
|---|---|---|---|
| 8,441,835 B2 | 5/2013 | Jo et al. | |
| 9,029,825 B2* | 5/2015 | Tada | H01L 27/2436 257/4 |
| 9,431,604 B2 | 8/2016 | Liao et al. | |
| 9,543,375 B2 | 1/2017 | Huang et al. | |
| 10,157,962 B2* | 12/2018 | Chen | H01L 27/2463 |
| 10,181,560 B2* | 1/2019 | Tseng | H01L 45/1233 |

OTHER PUBLICATIONS

Z. Wei et al., "Highly Reliable TaOx ReRAM and Direct Evidence of Redox Reaction Mechanism", 2008 IEEE International Electron Devices Meeting, 2008, 4 pages, IEEE.
An Chen et al., "Variability of Resistive Switching Memories and Its Impact on Crossbar Array Performance", IRPS11, 2011, pp. MY.7.1-MY.7.4, IEEE.
M. Nakayama, "ReRAM technologies: Applications and outlook", 2017, 4 pages, IEEE.
Mario Lanza, "A Review on Resistive Switching in High-k Dielectrics: A Nanoscale Point of View Using Conductive Atomic Force Microscope", Materials, 2014, pp. 2155-2182.
Zhuo-Rui Wang et al., "Functionally Complete Boolean Logic in 1T1R Resistive Random Access Memory", IEEE Electron Device Letters, Feb. 2017, pp. 179-182, vol. 38, No. 2, IEEE.

* cited by examiner

*Primary Examiner* — Chandra Chaudhari
(74) *Attorney, Agent, or Firm* — Viering Jentschura & Partner MBB; Natalie A. Lee

(57) ABSTRACT

A memory device may include a bottom electrode, first and second switching elements over the bottom electrode, and first and second top electrodes over the first and second switching elements respectively. The first and second top electrodes may include first and second contact surfaces in contact with the first and second switching elements respectively. The first and second switching elements may each have a resistance configured to switch between resistance values in response to changes in voltages applied between the top electrodes and the bottom electrode. The bottom electrode may include at least one conductive layer having third and fourth contact surfaces in contact with the first and second switching elements respectively. An area of the first contact surface may be greater than an area of the third contact surface, and an area of the second contact surface may be greater than an area of the fourth contact surface.

17 Claims, 9 Drawing Sheets

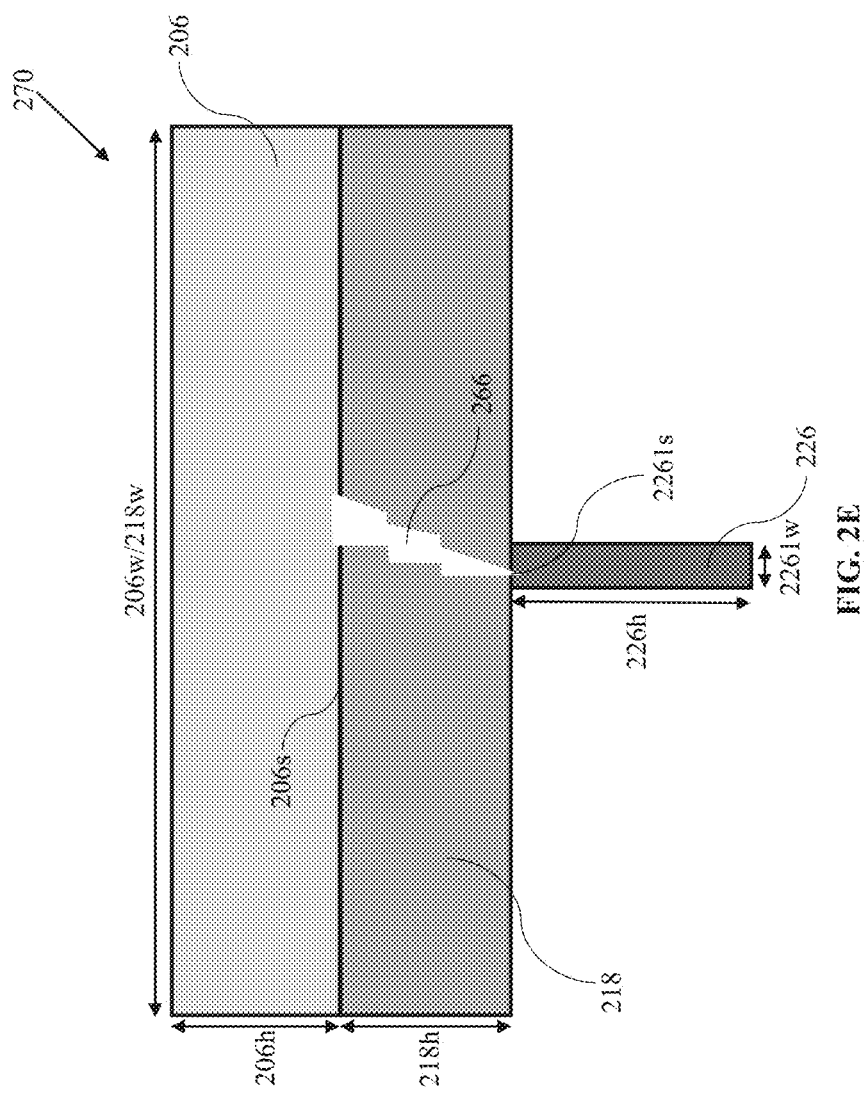

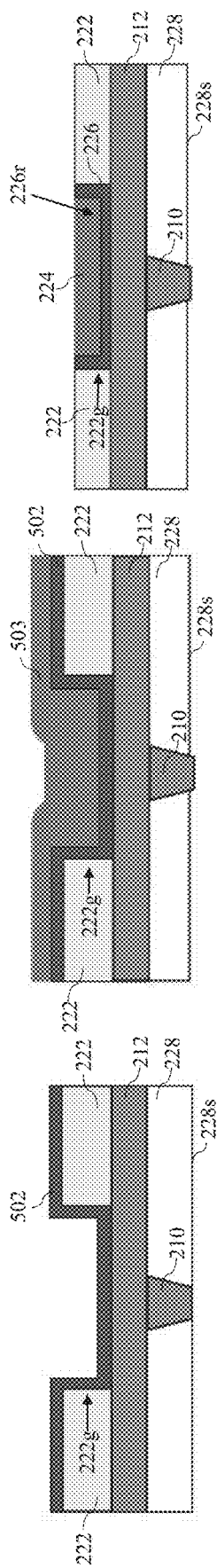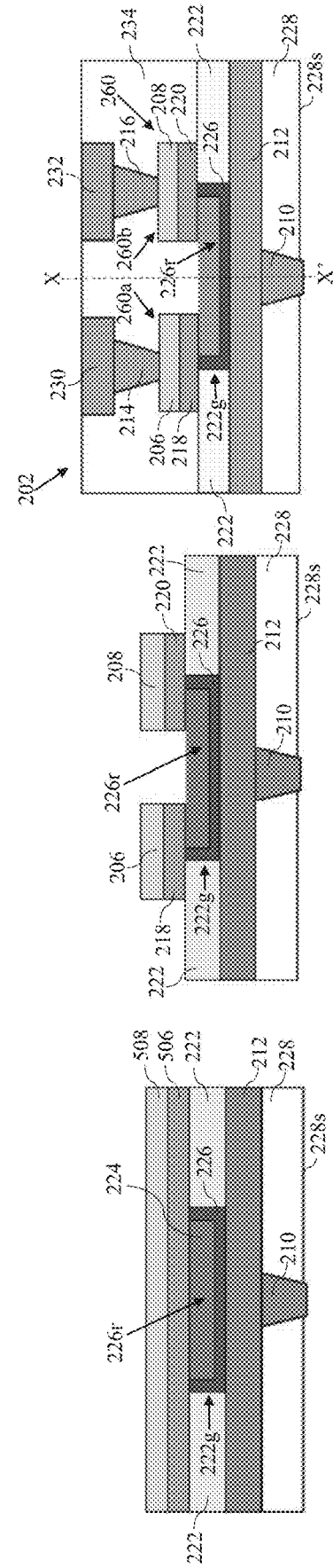

MEMORY DEVICE AND A METHOD FOR FORMING THE MEMORY DEVICE

TECHNICAL FIELD

The present disclosure relates generally to memory devices and methods for forming the memory devices.

BACKGROUND

Non-volatile memory devices are often used in consumer electronic products such as smart phones and tablets. There are various types of non-volatile memory devices such as resistive random access memory devices (ReRAMs), magnetic random access memory devices (MRAMs) and phase-change magnetic random access memory devices (PCRAMs). FIG. 1A shows a top view of a prior art memory cell 100 including a plurality of prior art non-volatile memory devices 102 electrically coupled to bit lines 150 (e.g. BL0, BL1, BL2, BL3) and word lines 152 (e.g. WL0, WL1, WL2, WL3). FIG. 1B shows a perspective view of one of the prior art memory devices 102 and FIG. 1C shows a cross-sectional view of one of the prior art memory devices 102 along the line A-A'. As shown in FIGS. 1A to 1C, the memory device 102 includes a top electrode 106, a bottom electrode 126 and a switching element 118 arranged between the top electrode 106 and the bottom electrode 126. For simplicity, only the top electrodes 106 are shown in FIG. 1A. The switching element 118 is normally insulating. However, upon application of a sufficiently high voltage difference between the top and bottom electrodes 106, 126, a dielectric breakdown event can occur, forming conducting filaments 166 within the switching element 118. The switching element 118 thus becomes conductive and the resistance of the switching element 118 decreases. A lower voltage difference may be applied between the top and bottom electrodes 106, 126 to break the conducting filaments 166, causing the resistance of the switching element 118 to increase. The prior art memory device 102 may be considered to be in a low resistance state (LRS) when the conducting filaments 166 are formed and in a high resistance state (HRS) when the conducting filaments 166 are broken.

Current non-volatile memory devices, such as prior art memory device 102, often suffer from plasma damage during a dry etch process carried out during fabrication of the devices. The dry etch process often causes cornering of the top electrodes and as a result, plasma damage often occur at the edges of the switching elements. Defects arising from such plasma damage can significantly limit the endurance performance of the memory devices. Further, the top and bottom electrodes of current non-volatile memory devices often have much larger dimensions than the conducting filaments formed within the switching elements. For example, a length 106*l* and a width 106*w* of the top electrode 106 of the prior art memory device 102 may both be greater than tens of nm. A length 126*l* and a width 126*w* of the bottom electrode 126 of the prior art memory device 102 may also be both greater than tens of nm. However, each conducting filament 166 formed within the switching element 118 may only be a few atoms in size or may have dimensions in the sub-nm range. Therefore, multiple conducting filaments 166 may be formed at random within the switching element 118, and there may be incomplete rupture at certain portions of the switching element 118. This may cause a huge variation in the resistance of the switching element 118 (and thus, the memory device 102) across multiple dielectric breakdown events.

It is therefore desirable to provide an improved memory device with less variability in its resistance and better endurance performance.

SUMMARY

According to various non-limiting embodiments, there may be provided a memory device including a bottom electrode, a first switching element and a second switching element arranged over the bottom electrode, a first top electrode arranged over the first switching element, and a second top electrode arranged over the second switching element. The first top electrode may include a first contact surface in contact with the first switching element. The second top electrode may include a second contact surface in contact with the second switching element. The first switching element may have a resistance configured to switch between a first resistance value and a second resistance value in response to a change in voltage applied between the first top electrode and the bottom electrode. The second switching element may have a resistance configured to switch between a third resistance value and a fourth resistance value in response to a change in voltage applied between the second top electrode and the bottom electrode. The bottom electrode may include at least one conductive layer having a third contact surface in contact with the first switching element and a fourth contact surface in contact with the second switching element. An area of the first contact surface may be greater than an area of the third contact surface, and an area of the second contact surface may be greater than an area of the fourth contact surface.

According to various non-limiting embodiments, there may be provided a method including forming a bottom electrode; forming a first switching element and a second switching element over the bottom electrode; forming a first top electrode over the first switching element; and forming a second top electrode over the second switching element. The first top electrode may include a first contact surface in contact with the first switching element. The second top electrode may include a second contact surface in contact with the second switching element. The first switching element may have a resistance configured to switch between a first resistance value and a second resistance value in response to a change in voltage applied between the first top electrode and the bottom electrode. The second switching element may have a resistance configured to switch between a third resistance value and a fourth resistance value in response to a change in voltage applied between the second top electrode and the bottom electrode. The bottom electrode may include at least one conductive layer having a third contact surface in contact with the first switching element and a fourth contact surface in contact with the second switching element. An area of the first contact surface may be greater than an area of the third contact surface, and an area of the second contact surface may be greater than an area of the fourth contact surface.

According to various non-limiting embodiments, there may be provided a memory cell including a plurality of memory devices. Each memory device may include a bottom electrode; a first switching element and a second switching element arranged over the bottom electrode; a first top electrode arranged over the first switching element; and a second top electrode arranged over the second switching element. The first top electrode may include a first contact surface in contact with the first switching element, and the second top electrode may include a second contact surface in contact with the second switching element. The first switching element may have a resistance configured to switch between a first resistance value and a second resistance value in response to a change in voltage applied between the first top electrode and the bottom electrode, and the second switching element may have a resistance configured to switch between a third resistance value and a fourth resistance value in response to a change in voltage applied between the second top electrode and the bottom electrode. The bottom electrode may include at least one conductive layer having a third contact surface in contact with the first switching element and a fourth contact surface in contact with the second switching element. An area of the first contact surface may be greater than an area of the third contact surface, and an area of the second contact surface may be greater than an area of the fourth contact surface.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which:

FIG. 4A to FIG. 4F show cross-sectional views that illustrate a method for fabricating the segment of FIG. 2B according to various non-limiting embodiments of the present invention.

DETAILED DESCRIPTION

Figure 1A:
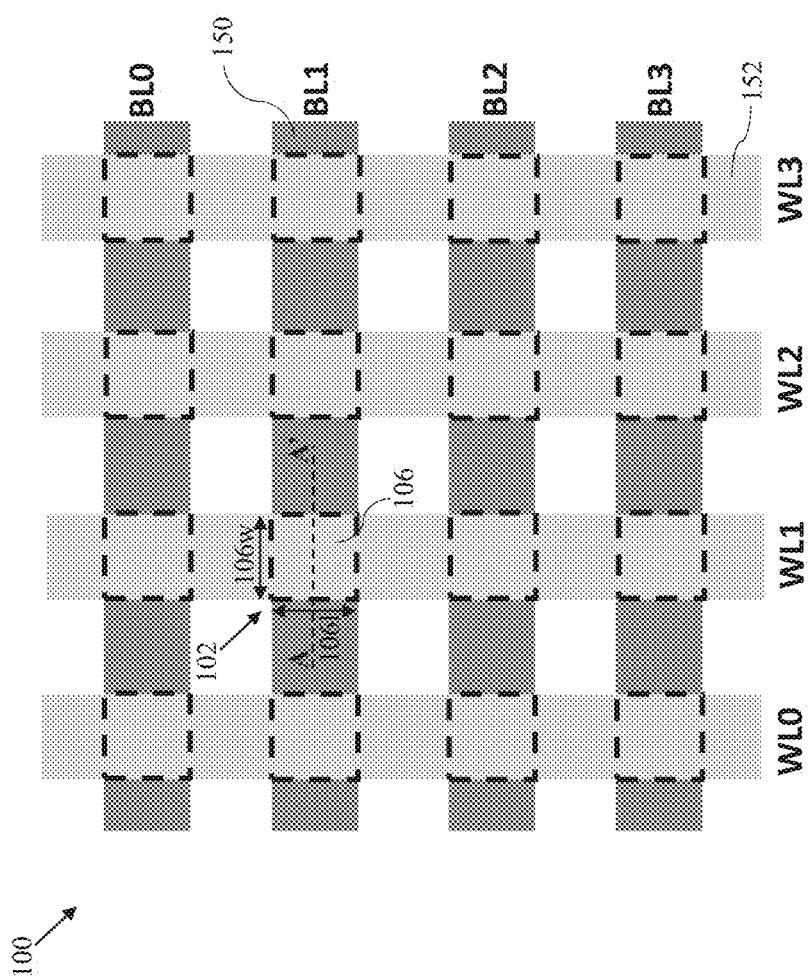
FIG. 1A shows a top view of a prior art memory cell including a plurality of prior art memory devices, and FIG. 1B and FIG. 1C respectively show a perspective view and a cross-sectional view of a prior art memory device of the memory cell of FIG. 1A.
Figures 1B, 1C:
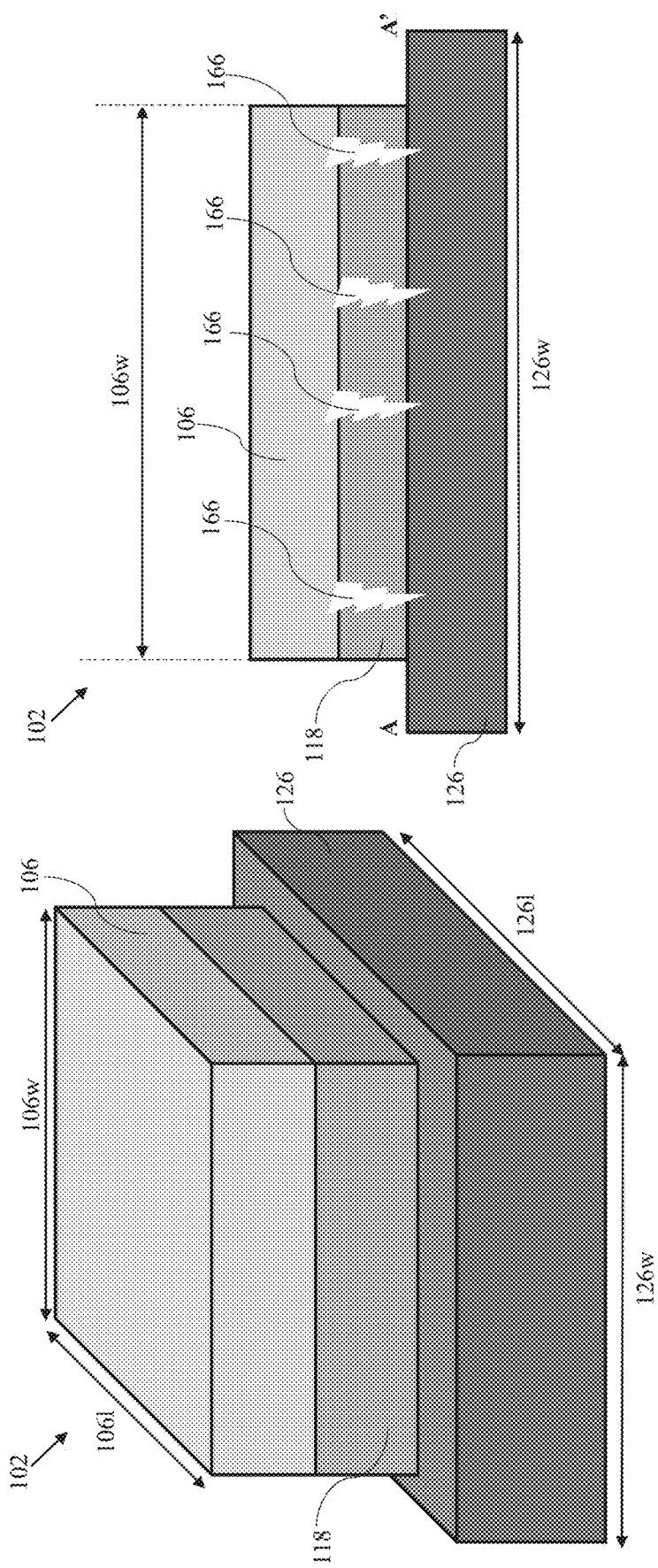

The embodiments generally relate to devices, such as semiconductor devices. More particularly, some embodiments relate to memory devices, for example, non-volatile memory devices such as ReRAMs, MRAMs and PCRAMs. The memory devices may be used to form memory cells that may be employed in various consumer electronic devices, such as smartphones and tablets. The memory devices may also be used in neuromorphic computing and for 0.18 um and below technology in a non-limiting embodiment.

According to various non-limiting embodiments, a memory device may include a bottom electrode, a first switching element and a second switching element arranged over the bottom electrode, a first top electrode arranged over the first switching element, and a second top electrode arranged over the second switching element. The first top electrode may include a first contact surface in contact with the first switching element. The second top electrode may include a second contact surface in contact with the second switching element. The first switching element may have a resistance configured to switch between a first resistance value and a second resistance value in response to a change in voltage applied between the first top electrode and the bottom electrode. The second switching element may have a resistance configured to switch between a third resistance value and a fourth resistance value in response to a change in voltage applied between the second top electrode and the bottom electrode. The bottom electrode may include at least one conductive layer having a third contact surface in contact with the first switching element and a fourth contact surface in contact with the second switching element. An area of the first contact surface may be greater than an area of the third contact surface, and an area of the second contact surface may be greater than an area of the fourth contact surface.

According to various non-limiting embodiments, a method may include forming a bottom electrode; forming a first switching element and a second switching element over the bottom electrode; forming a first top electrode over the first switching element; and forming a second top electrode over the second switching element. The first top electrode may include a first contact surface in contact with the first switching element. The second top electrode may include a second contact surface in contact with the second switching element. The first switching element may have a resistance configured to switch between a first resistance value and a second resistance value in response to a change in voltage applied between the first top electrode and the bottom electrode. The second switching element may have a resistance configured to switch between a third resistance value and a fourth resistance value in response to a change in voltage applied between the second top electrode and the bottom electrode. The bottom electrode may include at least one conductive layer having a third contact surface in contact with the first switching element and a fourth contact surface in contact with the second switching element. An area of the first contact surface may be greater than an area of the third contact surface, and an area of the second contact surface may be greater than an area of the fourth contact surface.

According to various non-limiting embodiments, a width of each of the third contact surface and the fourth contact surface may be less than 10 nm.

According to various non-limiting embodiments, the third contact surface of the bottom electrode may be arranged in a middle section of the first switching element and the fourth contact surface of the bottom electrode may be arranged in a middle section of the second switching element.

According to various non-limiting embodiments, the first contact surface of the top electrode may have a first edge and a second edge, and the third contact surface of the bottom electrode may have a first edge and a second edge substantially parallel to the first edge and the second edge of the first contact surface of the top electrode respectively. A distance between the first edges may be greater than a distance between the second edges.

According to various non-limiting embodiments, the memory device may further include a first insulating element arranged at least partially below each of the first and second switching elements, and a second insulating element arranged adjacent to the first insulating element and at least partially below each of the first and second switching elements. The at least one conductive layer may be arranged between the first insulating element and the second insulating element.

According to various non-limiting embodiments, the first insulating element may include a gap and the bottom electrode may be arranged within the gap of the first insulating element. The bottom electrode may include a recess and the second insulating element may be arranged within the recess of the bottom electrode.

According to various non-limiting embodiments, the method may further include forming a first insulating element and forming a second insulating element adjacent to the first insulating element. Forming the bottom electrode may include forming the at least one conductive layer between the first insulating element and the second insulating element. Forming the first and second switching elements may include forming the first and second switching elements such that the first insulating element and the second insulating element are each at least partially arranged below each of the first and second switching elements.

According to various non-limiting embodiments, forming the at least one conductive layer between the first insulating element and the second insulating element may include forming the at least one conductive layer over the first insulating element prior to forming the second insulating element; and removing at least a portion of the at least one conductive layer outside of the gap of the first insulating element.

According to various non-limiting embodiments, forming the second insulating element may include forming an insulating layer over the at least one conductive layer and removing at least a portion of the insulating layer outside of the gap of the first insulating element.

According to various non-limiting embodiments, removing at least a portion of the at least one conductive layer and/or the insulating layer outside of the gap of the first insulating element may include smoothing a surface of the first insulating element.

According to various non-limiting embodiments, a memory cell may include a plurality of memory devices. Each memory device may include a bottom electrode, a first switching element and a second switching element arranged over the bottom electrode, a first top electrode arranged over the first switching element, and a second top electrode arranged over the second switching element. The first top electrode may include a first contact surface in contact with the first switching element. The second top electrode may include a second contact surface in contact with the second switching element. The first switching element may have a resistance configured to switch between a first resistance value and a second resistance value in response to a change in voltage applied between the first top electrode and the bottom electrode. The second switching element may have a resistance configured to switch between a third resistance value and a fourth resistance value in response to a change in voltage applied between the second top electrode and the bottom electrode. The bottom electrode may include at least one conductive layer having a third contact surface in contact with the first switching element and a fourth contact surface in contact with the second switching element. An area of the first contact surface may be greater than an area of the third contact surface, and an area of the second contact surface may be greater than an area of the fourth contact surface.

According to various non-limiting embodiments, for one or more of the memory devices, a width of each of the third contact surface and the fourth contact surface may be less than 10 nm.

According to various non-limiting embodiments, for one or more of the memory devices, the third contact surface of the bottom electrode may be arranged in a middle section of the first switching element, and the fourth contact surface of the bottom electrode may be arranged in a middle section of the second switching element.

According to various non-limiting embodiments, for one or more of the memory devices, the first contact surface of the top electrode may have a first edge and a second edge, and the third contact surface of the bottom electrode may have a first edge and a second edge substantially parallel to the first edge and the second edge of the first contact surface of the top electrode respectively. A distance between the first edges may be greater than a distance between the second edges.

According to various non-limiting embodiments, for one or more of the memory devices, the memory device may further include a first insulating element arranged at least partially below each of the first and second switching elements, and a second insulating element arranged adjacent to the first insulating element and at least partially below each of the first and second switching elements. The at least one conductive layer may be arranged between the first insulating element and the second insulating element.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 2A:
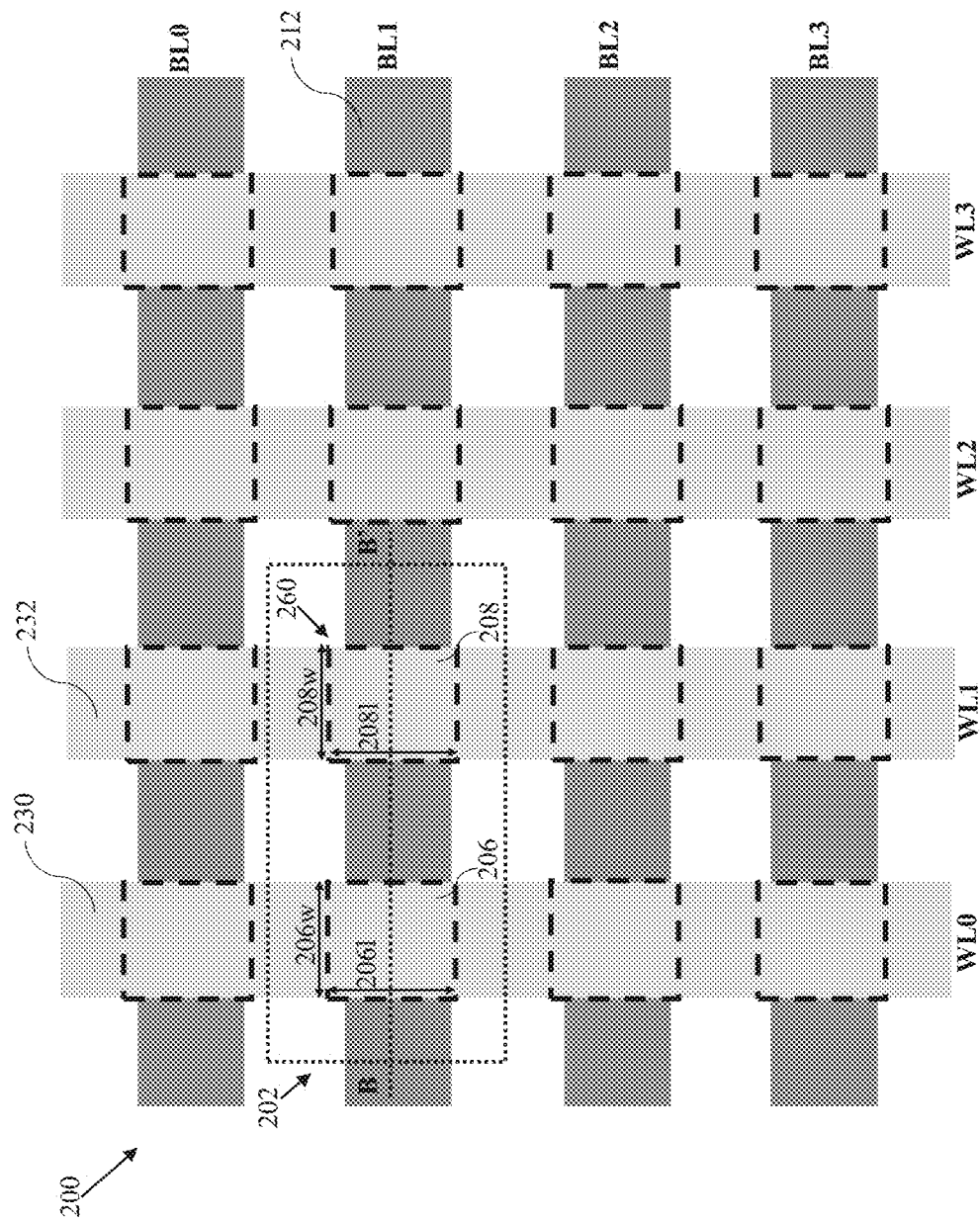
FIG. 2A shows a top view of a memory cell including a plurality of memory devices according to various non-limiting embodiments of the present invention.

FIG. 2A shows a top view of a memory cell 200 according to various non-limiting embodiments of the present invention. The memory cell 200 may be in the form of a cross-bar structure and may include a plurality of memory devices 260 which may be ReRAMs in various non-limiting embodiments. The memory devices 260 may be electrically coupled to bit lines 212 (e.g. BL0, BL1, BL2, BL3) and word lines 230, 232 (e.g. WL0, WL1, WL2, WL3). As shown in FIG. 2A, memory devices 260 along the same row may share a common bit line 212; whereas, memory devices 260 along the same column may share common word lines 230/232.

Figure 2B:
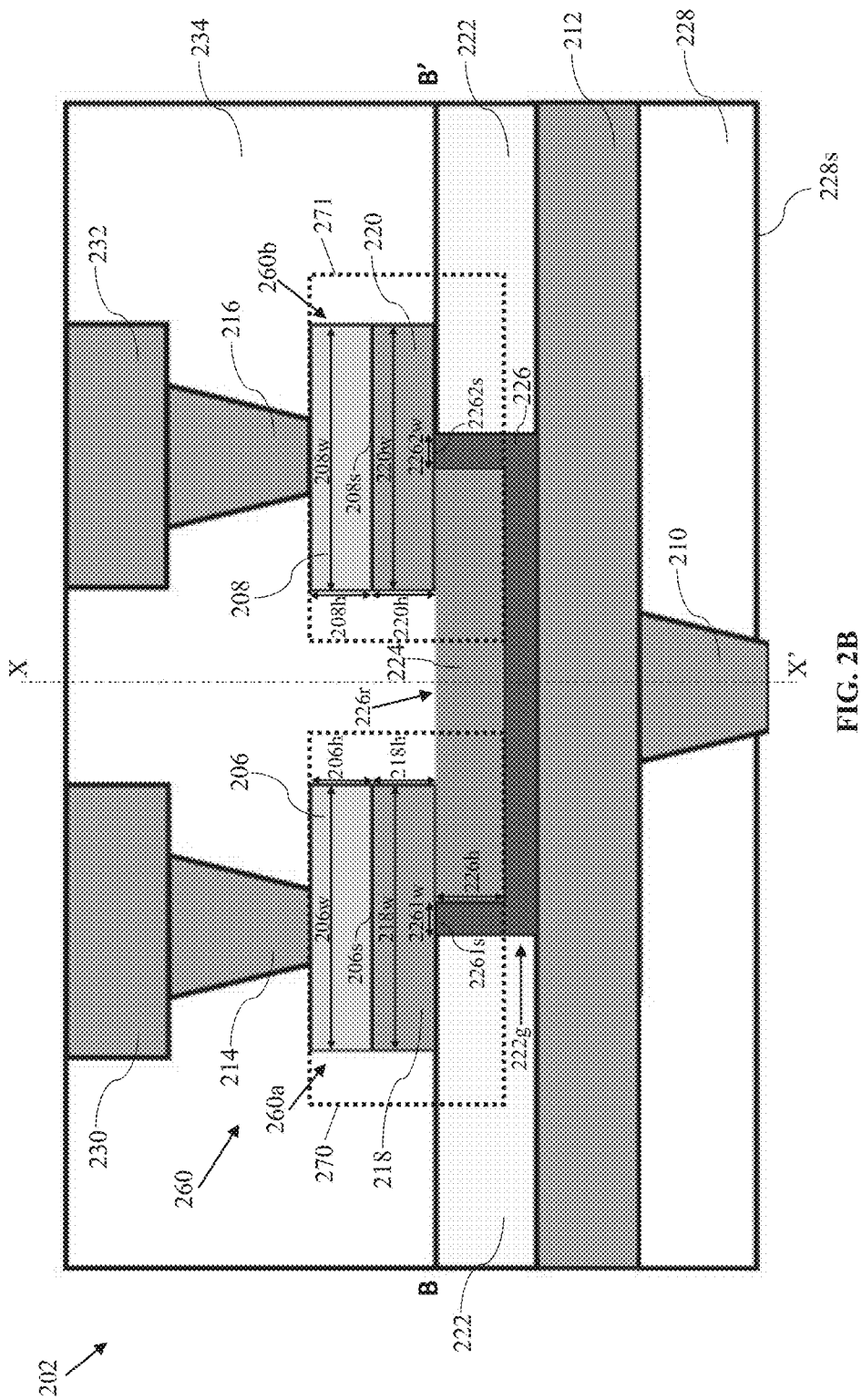
FIG. 2B shows a cross-sectional view of a segment of the memory cell of FIG. 2A including a memory device, FIG. 2C and FIG. 2D respectively show a perspective view and a top view of a segment of the memory device of FIG. 2B.

FIG. 2B shows a cross-sectional view of a segment 202 of the memory cell 200 along the line B-B' according to various non-limiting embodiments. The segment 202 may include a first insulation layer 228. The segment 202 may also include a first conductive element 210 and a part of the bit line 212 (e.g. BL1 in FIG. 1A) at least partially arranged within the first insulation layer 228. The first conductive element 210 may taper toward a bottom surface 228s of the first insulation layer 228. Referring to FIG. 2B, in various non-limiting embodiments, a part of the first conductive element 210 may protrude beyond the bottom surface 228s of the first insulation layer 228. The bit line 212 may be arranged over the first conductive element 210. The bit line 212 may be electrically coupled to the first conductive element 210. For example, as shown in FIG. 2B, the bit line 212 may be in contact with the first conductive element 210. In various non-limiting embodiments, the bit line 212 may be referred to as metal layer i, the first insulation layer 228 may be a dielectric layer referred to as the inter-metal-dielectrics (IMD) of metal layer i ($M_i$) and the first conductive element 210 may be referred to as an interconnect or a via. The first conductive element 210 may connect the bit line 212 to a further metal layer ($M_{i-1}$) (not shown in the figures) below the first insulation layer 228.

The segment 202 may further include a memory device 260. The memory device 260 may include a bottom electrode 226 arranged over the bit line 212. For example, the bottom electrode 226 may be electrically coupled to the bit line 212. The memory device 260 may further include a first insulating element 222 and a second insulating element 224 arranged over the bit line 212. The second insulating element 224 may be arranged adjacent to the first insulating element 222 and the bottom electrode 226 may include at least one conductive layer arranged between the first insulating element 222 and the second insulating element 224. For example, as shown in FIG. 2B, the first insulating element 222 may include a gap 222g within the first insulating element 222, and the bottom electrode 226 may be arranged within the gap 222g in the first insulating element 222. For example, the bottom electrode 226 may include at least one conductive layer lining an inner surface of the gap 222g and may include a recess 226r. The second insulating element 224 may be arranged within the recess 226r of the bottom electrode 226.

Referring to FIG. 2B, the memory device 260 may include a first portion 260a and a second portion 260b arranged above the insulating elements 222, 224 and the bottom electrode 226.

The first portion 260a of the memory device 260 may include a first switching element 218 arranged over the bottom electrode 226. The first insulating element 222 may be arranged at least partially below the first switching element 218 and the second insulating element 224 may also be arranged at least partially below the first switching element 218. The first portion 260a of the memory device 260 may further include a first top electrode 206 arranged over the first switching element 218.

As shown in FIG. 2B, in various non-limiting embodiments, the first portion 260a and the second portion 260b of the memory device 260 may be similar or identical and the memory device 260 may be symmetric about the axis X-X'. For example, the second portion 260b of the memory device 202 may include a second switching element 220 arranged over the bottom electrode 226 and a second top electrode 208 arranged over the second switching element 220. The second switching element 220 and the second top electrode 208 may be similar or identical to the first switching element 218 and the first top electrode 206 respectively. The arrangement of the second switching element 220 and the second top electrode 208 of the second portion 260b in relation to each other and to the rest of the segment 202 may also be the same or similar to that of the first portion 260a. For example, the first insulating element 222 may be arranged at least partially below the second switching element 220 and the second insulating element 224 may also be arranged at least partially below the second switching element 220. In various non-limiting embodiments, segments 270, 271 of the memory device 260 as shown in FIG. 2B may be symmetric about the axis X-X' and may each be referred to as a memory unit. Note that for simplicity, only the top electrodes 206, 208 of the memory devices 260 are shown in FIG. 2A. Further, the memory cell 200 may include front-end-of-line (FEOL) devices but these are not shown in the figures to avoid cluttering the figures.

Referring to FIG. 2B, the first top electrode 206 may include a first contact surface 206s in contact with the first switching element 218 and the second top electrode 208 may include a second contact surface 208s in contact with the second switching element 220. The bottom electrode 226 may include a third contact surface 2261s in contact with the first switching element 218 and a fourth contact surface 2262s in contact with the second switching element 220. In various non-limiting embodiments, the third contact surface 2261s of the bottom electrode 226 may be arranged in a middle section of the first switching element 218 and the fourth contact surface 2262s of the bottom electrode 226 may be arranged in a middle section of the second switching element 220.

Referring to FIG. 2B, the segment 202 may further include a second insulation layer 234. The segment 202 may also include a second conductive element 214 and a third conductive element 216 arranged at least partially within the second insulation layer 234. The second and third conductive elements 214, 216 may taper toward the top electrodes 206, 208 respectively. A first word line 230 may be arranged over the second conductive element 214 and a second word line 232 may be arranged over the third conductive element 216. The second conductive element 214 may electrically couple the first word line 230 to the first top electrode 206, and the third conductive element 216 may electrically couple the second word line 232 to the second top electrode 208. In various non-limiting embodiments, the first and second word lines 230, 232 may be referred to as metal layer i+1.

Figure 2C:
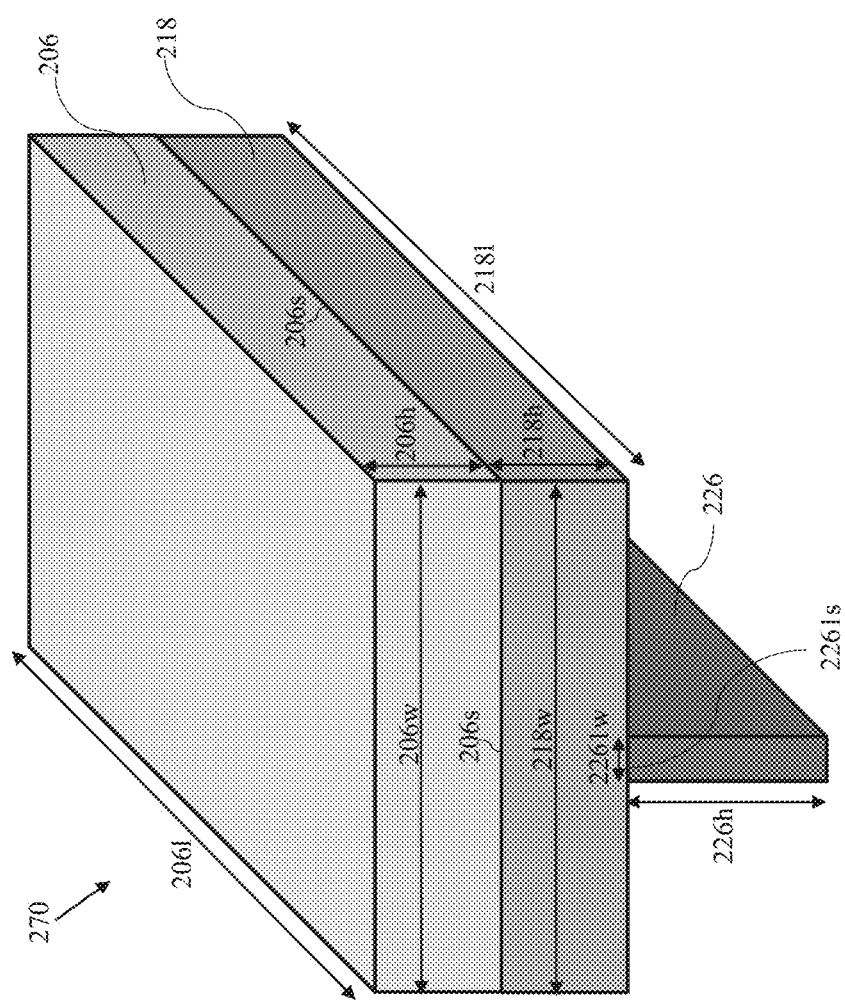
FIG. 2E shows a cross-sectional view of the segment of FIG. 2C when the memory device is in use.
Figure 2B:
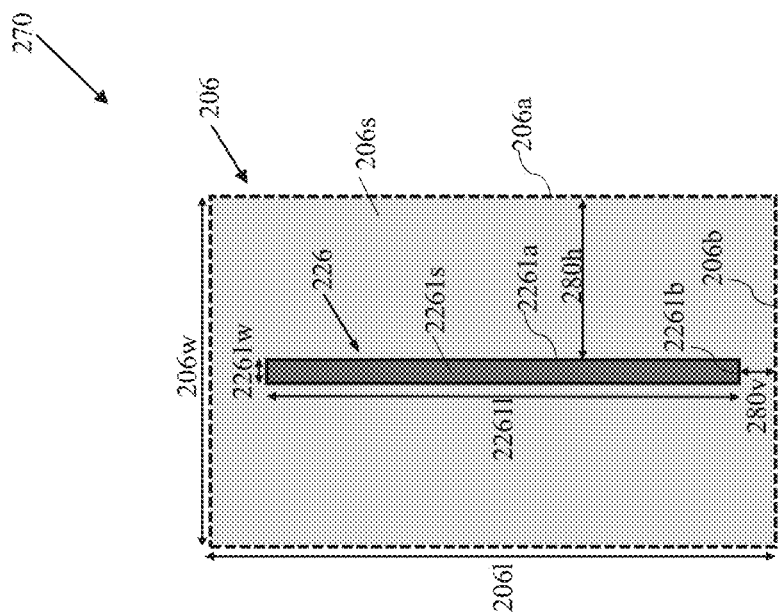

FIG. 2C shows a perspective view of the segment 270 of the memory device 260 including the first top electrode 206, the first switching element 218 and a part of the bottom electrode 226 including the third contact surface 2261s, and FIG. 2D shows a top view of the segment 270 of the memory device 260. Note that the second insulating element 224 has been omitted from FIGS. 2C, 2D and 2E for simplicity. As more clearly shown in FIG. 2C and FIG. 2D, the first top electrode 206 may have a length 206l, a width 206w and a height 206h, the first switching element 218 may have a length 218l, a width 218w and a height 218h, the third contact surface 2261s of the bottom electrode 226 may have a length 2261l and a width 2261w, and the recess 226r of the bottom electrode 226 may have a depth 226h. The length 206l of the first top electrode 206 may be substantially equal to the length 218l of the first switching element 218, and may be greater than the length 2261l of the third contact surface 2261s of the bottom electrode 226. The width 206w of the first top electrode 206 may be substantially equal to the width 218w of the first switching element 218, and may be greater than the width 2261w of the third contact surface 2261s of the bottom electrode 226. The segment 271 of the memory device 260 may be similar or identical to the segment 270. According to various non-limiting embodiments, the length 206l of the first top electrode 206 may range from about 2 nm to about 900 nm, the width 206w of the first top electrode 206 may range from about 2 nm to about 900 nm, and the height 206h of the first top electrode 206 may range from about 2 nm to about 900 nm. The length 218l of the first switching element 218 may range from about 2 nm to about 900 nm, the width 218w of the first switching element 218 may range from about 2 nm to about 900 nm, and the height 218h of the first switching element 218 may range from about 2 nm to about 900 nm. The length (not shown in the figures) of the second top electrode 208 may range from about 2 nm to about 900 nm, the width 208w of the second top electrode 208 may range from about 2 nm to about 900 nm, and the height 208h of the second top electrode 208 may range from about 2 nm to about 900 nm. The length (not shown in the figures) of the second switching element 220 may range from about 2 nm to about 900 nm, the width 220w of the second switching element 220 may range from about 2 nm to about 900 nm, and the height 220h of the second switching element 220 may range from about 2 nm to about 900 nm. The length 2261l of the third contact surface 2261s of the bottom electrode 226 may range from about 2 nm to about 900 nm, and the width 2261w of the third contact surface 2261s of the bottom electrode 226 may be less than 10 nm (for example, may range from about 1 nm to about 10 nm). The length (not shown in the figures) of the fourth contact surface 2262s of the bottom electrode 226 may range from about 2 nm to about 900 nm, and the width 2262w of the fourth contact surface 2262s of the bottom electrode 226 may be less than 10 nm (for example, may range from about 1 nm to about 10 nm). The depth 226h of the recess 226r of the bottom electrode 226 may range from about 10 nm to about 900 nm. However, other dimensions may be possible in other alternative non-limiting embodiments.

In various embodiments, an area of the first contact surface 206s of the first top electrode 206 may be greater than an area of the third contact surface 2261s of the bottom electrode 226, and an area of the second contact surface 208s of the second top electrode 208 may be greater than an area of the fourth contact surface 2262s of the bottom electrode 226. According to various non-limiting embodiments, the area of each of the third contact surface 2261s and the fourth contact surface 2262s of the bottom electrode 226 may range from about 2 nm$^2$ (e.g. length of 2 nm×width of 1 nm) to about 9000 nm$^2$ (e.g. length of 900 nm×width of 10 nm). According to various non-limiting embodiments, an area of the first contact surface 206s compared to an area of the third contact surface 2261s may have a ratio ranging from 10:1 to 1000:1. According to various non-limiting embodiments, an area of the second contact surface 208s compared to an area of the fourth contact surface 2262s may have a ratio ranging from 10:1 to 1000:1.

Referring to FIG. 2D, in a non-limiting example, the first contact surface 206s of the first top electrode 206 may have a first edge 206a (with a length substantially equal to the length 206l) and a second edge 206b (with a length substantially equal to the width 206w). The third contact surface 2261s may have a first edge 2261a (with a length substantially equal to the length 2261l) and a second edge 2261b (with a length substantially equal to the width 2261w). The first edges 206a, 2261a of the contact surfaces 206s, 2261s may be substantially parallel to each other. Similarly, the second edges 206b, 2261b of the contact surfaces 206s, 2261s may be substantially parallel to each other. As shown in FIG. 2D, a distance 280h between the first edges 206a, 2261a of the contact surfaces 206s, 2261s may be greater than a distance 280v between the second edges 206b, 2261b of the contact surfaces 206s, 2261s. Said differently, a difference between the widths 206w, 2261w may be greater than a difference between the lengths 206l, 2261l. By arranging the first edge 206a of the first contact surface 206s further away from the first edge 2261a of the third contact surface 2261s, the first edge 2261a of the bottom electrode 226 may be protected from plasma damage during formation of the first top electrode 206 and the first switching element 218. Note that the edges 206a, 2261a, 206b, 2261b, and distances 280h, 280v are not labelled in the remaining figures to avoid cluttering the figures. In various embodiments, the second contact surface 208s of the second top electrode 208 and the fourth contact surface 2262s of the bottom electrode 226 may have edges similar or identical to those of the first contact surface 206s and the third contact surface 2261s respectively.

FIG. 2E shows a cross-sectional view of the segment 270 of the memory device 260 when the memory device 260 is in use. The first switching element 218 may have a resistance configured to switch between a first resistance value and a second resistance value in response to a change in voltage applied between the first top electrode 206 and the bottom electrode 226. For example, when a first voltage is applied between the first top electrode 206 and the bottom electrode 226, a conducting filament 266 may be formed within the first switching element 218, and the resistance of the first switching element 218 may have a first resistance value. When a second voltage lower than the first voltage is applied between the first top electrode 206 and the bottom electrode 226, the conducting filament 266 may be broken and the resistance of the first switching element 218 may have a second resistance value higher than the first resistance value. The segment 270 may be considered to be in a low resistance state (LRS) when the conducting filament 266 is formed and in a high resistance state (HRS) when the conducting filament 266 is broken. As shown in FIG. 2E, in various non-limiting embodiments, the dimensions of the first top electrode 206, first switching element 218 and bottom electrode 226 may be configured such that only a single conducting filament 266 is formed when the first voltage is applied between the first top electrode 206 and the bottom electrode 226. However, in other alternative embodiments, more than one conducting filament 266 may be formed. In various non-limiting embodiments, the segments 270 and 271 of the memory device 260 may vary between a LRS and a HRS in a similar manner. For example, the second switching element 220 may have a resistance configured to switch between a third resistance value and a fourth resistance value (higher than the third resistance value) in response to a change in voltage applied between the second top electrode 208 and the bottom electrode 226 in a manner similar to that described above. In various embodiments, the first resistance value of the first switching element 218 may be the same as the third resistance value of the second switching element 220. However, in alternative embodiments, the first resistance value of the first switching element 218 may be different from the third resistance value of the second switching element 220. In various embodiments, the second resistance value of the first switching element 218 may be the same as the fourth resistance value of the second switching element 220. However, in alternative embodiments, the second resistance value of the first switching element 218 may be different from the fourth resistance value of the second switching element 220. Accordingly, the memory device 260 may carry two bits, the first bit being dependent on the state of the segment 270 and the second bit being dependent on the state of the segment 271.

Figure 3B:
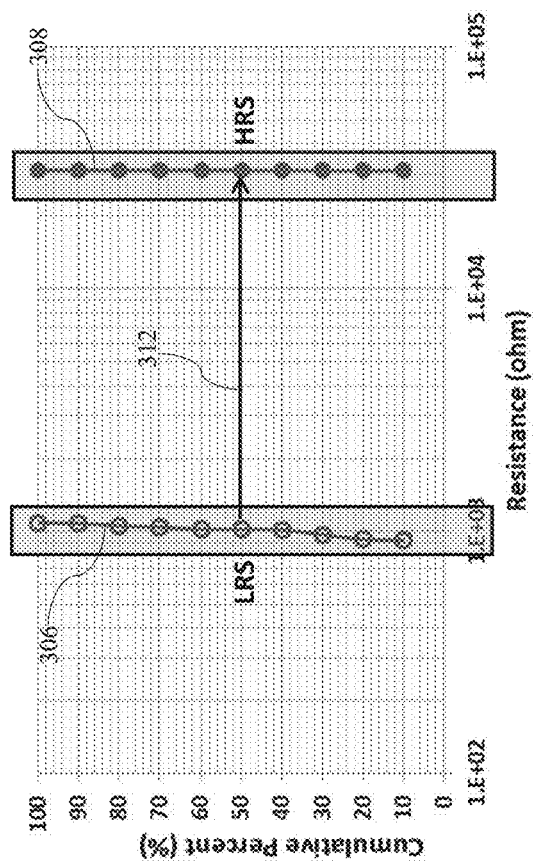
FIG. 3A and FIG. 3B respectively show variations in the resistances of the prior art memory device of FIG. 1A and the segment of FIG. 2C.
Figure 3A:
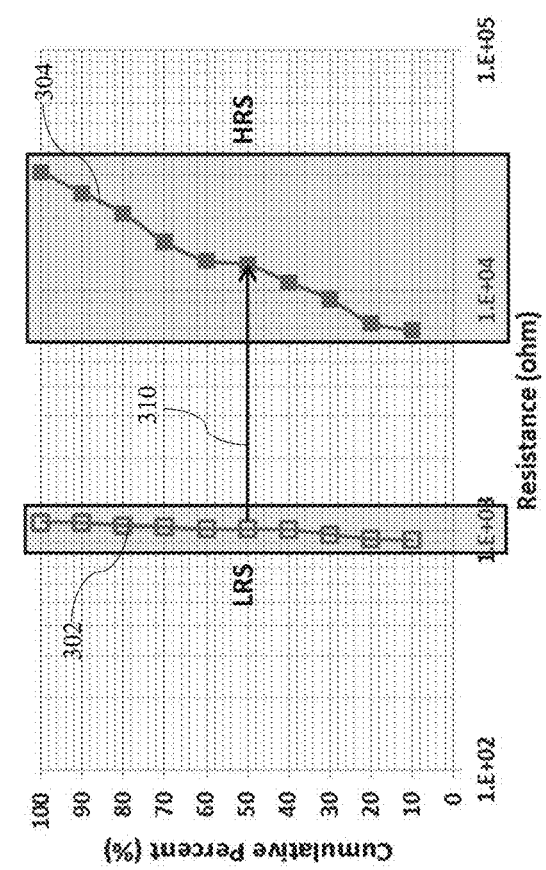

FIG. 3A shows variations in the resistance of the switching element 118 of the prior art memory device 102 and FIG. 3B shows variations in the resistance of the first switching element 218 of the segment 270 of the memory device 260. In particular, in FIG. 3A, plot 302 shows the variation in the resistance of the switching element 118 when the prior art memory device 102 is in the LRS and plot 304 shows the variation in the resistance of the switching element 118 when the prior art memory device 102 is in the HRS. In FIG. 3B, plot 306 shows the variation in the resistance of the first switching element 218 when the segment 270 is in the LRS and plot 308 shows the variation in the resistance of the first switching element 218 when the segment 270 is in the HRS.

As shown in FIGS. 3A and 3B, the variations of the resistances of the switching elements 118, 218 may be approximately the same when the prior art memory device 102 and the segment 270 are in the LRS. However, when the prior art memory device 102 and the segment 270 are in the HRS, the variation in the resistance of the first switching element 218 of the segment 270 may be much lower than the variation in the resistance of the switching element 118 of the prior art memory device 102. When the prior art memory device 102 and the segment 270 are in the HRS, the standard deviation ratio of the resistance of the segment 270 may be about 54, whereas the standard deviation ratio of the resistance of the prior art memory device 102 may be about 8008. In other words, in the HRS, the standard deviation ratio of the resistance of the segment 270 may be only about 0.007 of the standard deviation ratio of the resistance of the prior art memory device 102. Further, the cell window 310 of the prior art memory device 102 may be about 13×; whereas, the cell window 312 of the segment 270 may be about 31×. In other words, the cell window 312 of the segment 270 may be about 2.4× larger than the cell window 310 of the prior art memory device 102. The cell window 310/312 may be calculated as the median resistance of the memory device 102/segment 270 in the HRS divided by the median resistance of the memory device 102/segment 270 in the LRS.

Due to the much smaller dimensions of the bottom electrode 226 (e.g. the widths 2261w, 2262w of the bottom electrode 226 may be less than 10 nm), the areas of the third and fourth contact surfaces 2261s, 2262s of the bottom electrode 226 may be much smaller than prior art memory devices. Therefore, the regions in which conducting filaments 266 may be formed within the switching elements 218, 220 (in other words, the conducting filament formation regions) are confined to much smaller regions. The resistance distribution (in other words, variability in the resistance) of each segment 270, 271 of the memory device 260 may thus be decreased especially when the segment 270/271 is in the HRS. In turn, the cell window and the read current distribution of the memory device 260 may improve significantly. Further, plasma etch damage of the switching elements 218, 220 usually occurs at the edges of the switching elements 218, 220. Since the third and fourth contact surfaces 2261s, 2262s between the bottom electrode 226 and the switching elements 218, 220 may be much smaller than the switching elements 218, 220, and may be arranged approximately in middle sections of the switching elements 218, 220, the conducting filament formation regions may be sufficiently far from the edges of the switching elements 218, 220, such that they are substantially free of defects caused by plasma etch damage. This helps to improve the endurance performance of the memory device 260.

FIGS. 4A to 4F show cross-sectional views that illustrate a method for fabricating the memory cell 200, particularly the segment 202 of the memory cell 200 according to various non-limiting embodiments of the present invention. In various non-limiting embodiments, the memory cell 200 may be fabricated using a complementary-metal-oxide-semiconductor back-end-of-line (CMOS BEOL) process and the memory devices 260 may be integrated into the BEOL metal layers. Further, in various non-limiting embodiments, the segment 202 of the memory cell 200 may be formed over a previously formed metal layer $M_{i-1}$ that is not shown in FIGS. 4A to 4F. Note that to avoid cluttering the figures, the contact surfaces 206s, 208s, 2261s, 2262s, the widths 206w, 208w, 2261w, 2262w, the heights 206h, 218h, 208h, 220h and depth 226h, and segments 270, 271 are not labelled in FIGS. 4A to 4F.

Referring to FIG. 4A, according to various non-limiting embodiments, a method for fabricating the segment 202 may begin by forming the first insulation layer 228 over the previously formed metal layer $M_{i-1}$. The method may further include forming the first conductive element 210 and the bit line 212 at least partially within the first insulation layer 228. The first insulation layer 228 may include silicon oxide, silicon nitride or combinations thereof, and may be formed using any technique known to those skilled in the art. The first conductive element 210 and the bit line 212 may include aluminium, copper, tungsten, alloys thereof or combinations thereof, and may be formed using any technique known to those skilled in the art. The method may further include forming the first insulating element 222 having the gap 222g over the first insulation layer 228. In various non-limiting embodiments, the first insulating element 222 may be formed by depositing an insulating layer over the first insulation layer 228 and removing a portion of the insulating layer to form the gap 222g by, for example, etching the insulating layer using a photoresist mask. The insulating layer may include silicon oxide, silicon dioxide, silicon nitride or combinations thereof. However, other materials and techniques as known to those skilled in the art may also be used.

The method may include forming the bottom electrode 226 prior to forming the top electrodes 206, 208. Referring to FIG. 4A to 4C, the method may include forming the bottom electrode 226 including the recess 226r and forming the second insulating element 224 within the recess 226r of the bottom electrode 226 adjacent to the first insulating element 222.

In various non-limiting embodiments, forming the bottom electrode 226 may include forming at least one conductive layer over the first insulating element 222 prior to forming the second insulating element 224. For example, forming the bottom electrode 226 may include forming at least one conductive layer 502 over the first insulating element 222 (e.g. at least partially within the gap 222g as shown in FIG. 4A) prior to forming the second insulating element 224, and removing at least a portion of the at least one conductive layer 502 outside of the gap 222g of the first insulating element 222 (as shown in FIG. 4C). The at least one conductive layer 502 may be deposited over the first insulating element 222, such that at least a part of the at least one conductive layer 502 lines an inner surface of the gap 222g. The at least one conductive layer 502 may have a thickness substantially equal to the desired widths 2261w, 2262w of the third and fourth contact surfaces 2261s, 2262s of the bottom electrode 226. In various non-limiting embodiments, the thickness of the at least one conductive layer 502 may range from 1 nm to 10 nm. By forming such a conductive liner, a bottom electrode 226 having contact surfaces 2261s, 2262s with widths 2261w, 2262w less than 10 nm may be formed without using expensive lithography techniques. The conductive layer(s) 502 may include metal, such as but not limited to, platinum, iridium, tantalum, titanium nitride, alloys thereof, or combinations thereof. However, other materials as known to those skilled in the art may also be used.

Forming the second insulating element 224 may include forming an insulating layer 503 over the at least one conductive layer 502 (as shown in FIG. 4B) and removing at least a portion of the insulating layer 503 outside of the gap 222g of the first insulating element 222 (as shown in FIG. 4C). The insulating layer 503 may include silicon oxide, silicon dioxide, silicon nitride, or combinations thereof, but other materials as known to those skilled in the art may also be used.

In various non-limiting embodiments, removing at least a portion of the at least one conductive layer 502 and removing at least a portion of the insulating layer 503 may be performed simultaneously by, for example, smoothing a surface of the first insulating element 222 facing away from the first insulation layer 228 using techniques, such as but not limited to, chemical mechanical polishing (CMP). However, other techniques as known to those skilled in the art may also be used. In alternative non-limiting embodiments, a portion of the at least one conductive layer 502 may be removed after removing a portion of the insulating layer 503.

Referring to FIG. 4D and FIG. 4E, the method may further include forming the first switching element 218 and the second switching element 220 over the bottom electrode 226, and forming the first top electrode 206 and the second top electrode 208 over the respective switching elements 218, 220.

In various non-limiting embodiments, as shown in FIG. 4D, forming the switching elements 218, 220 and the top electrodes 206, 208 may begin by depositing a switching element layer 506 over the first and second insulating elements 222, 224 and bottom electrode 226, and depositing at least one conductive layer 508 over the switching element layer 506. The deposition of the switching element layer 506 and the at least one conductive layer 508 may be carried out using any technique as known to those skilled in the art. In various non-limiting embodiments, the switching element layer 506 may include transition metal oxide, such as, but not limited to, tantalum oxide (TaOx), titanium oxide (TiOx), titanium oxy nitride (TiON), silicon oxide (SiOx), aluminium oxide (AlOx), niobium oxide (NbOx), hafnium oxide (HfOx), and combinations thereof. The conductive layer(s) 508 may include metal, such as but not limited to platinum, iridium, tantalum, titanium nitride, alloys thereof or combinations thereof. However, other materials as known to those skilled in the art may also be used.

The switching elements 218, 220 and the top electrodes 206, 208 may be formed simultaneously in a non-limiting embodiment. For example, as shown in FIG. 4E, a portion of the switching element layer 506 and a portion of the at least one conductive layer 508 may be removed simultaneously using techniques, such as but not limited to dry etching. The removal of the portion of the switching element layer 506 to form the switching elements 218, 220 may be carried out such that the first insulating element 222 and the second insulating element 224 are each at least partially below each of the switching elements 218, 220. The dry etching of the layers 506, 508 may result in plasma damage to the edges of the top electrodes 206, 208 and the edges of the switching elements 218, 220. However, since the third and fourth contact surfaces 2261s, 2262s of the bottom electrode 226 in contact with the switching elements 218, 220 may be much smaller than the switching elements 218, 220 and may be arranged substantially in the middle of the switching elements 218, 220, the bottom electrode 226 may be substantially free of plasma damage caused by the dry etching.

In alternative non-limiting embodiments, the switching elements 218, 220 and the top electrodes 206, 208 need not be formed simultaneously and may be formed using other techniques as known to those skilled in the art. For example, the method may include removing a portion of the at least one conductive layer 508 to form the top electrodes 206, 208 before removing a portion of the switching element layer 506 to form the switching elements 218, 220. This allows for switching elements 218, 220 that are wider than the top electrodes 206, 208 (e.g. the width 218w may be larger than the width 206w, and the width 220w may be larger than the width 208w) in various non-limiting embodiments. In alternative non-limiting embodiments, the top electrodes 206, 208 may have smaller widths than the switching elements 218, 220 (e.g. the width 206w may be smaller than the width 218w, and the width 208w may be smaller than the width 220w), and the method may include first removing a portion of both the conductive layer(s) 508 and the switching element layer 506, and then removing a further portion of the conductive layer(s) 508.

Referring to FIG. 4F, the method may further include forming the second insulation layer 234 over the first and second insulating elements 222, 224, and the top electrodes 206, 208, and forming the second and third conductive elements 214, 216, and the word lines 230, 232. In various non-limiting embodiments, forming the conductive elements 214, 216 and word lines 230, 232 may include using a typical back end of line (BEOL) process as known to those skilled in the art. For example, the second insulation layer 234 may first be deposited and portions of the second insulation layer 234 intended for the conductive elements 214, 216, and word lines 230, 232 may be removed to form openings or trenches, after which conductive material may be deposited into these openings or trenches. However, other techniques as known to those skilled in the art may be used. In various non-limiting embodiments, the second insulation layer 234 may include silicon oxide, silicon dioxide, silicon nitride, or combinations thereof, and the conductive elements 214, 216 and word lines 230, 232 may include aluminium, copper, tungsten, alloys thereof or combinations thereof but other materials as known to those skilled in the art may be used.

The above described order of the steps for the method is only intended to be illustrative, and the steps of the method of the present invention are not limited to the above specifically described order unless otherwise specifically stated.

The memory device 260 need not be a ReRAM. In various alternative non-limiting embodiments, the switching elements 218, 220 may instead include magnetic tunnel junctions and the memory device 260 may be a MRAM. Alternatively, the switching elements 218, 220 may include phase-change materials and the memory device 260 may be a PCRAM. In yet alternative non-limiting embodiments, the memory device 260 may be any other resistive-based non-volatile memory device where the resistances of the switching elements 218, 220 may be switched by applying appropriate voltage differences between the top and bottom electrodes 206, 208, 226. In various non-limiting embodiments, a memory cell similar to the memory cell 200 may be provided, where the memory cell may include one or more of ReRAMs, MRAMs, PCRAMs or other resistive-based memory devices.

In various non-limiting embodiments, the memory device 260 may be part of a semiconductor structure that may include a substrate. The semiconductor structure may also include a further device such as a transistor having a source region and a drain region at least partially arranged within the substrate, a channel region between the source region and the drain region, and a gate arranged over the channel region. In a non-limiting example, a semiconductor structure may include a single memory device 260 and a transistor, and the bottom electrode 226 of the memory device 260 may be electrically coupled to the source region or the drain region of the transistor. In other non-limiting examples, a semiconductor structure may include first and second memory devices 260 and a transistor. The bottom electrode 226 of the first memory device 260 may be electrically coupled to the source region (or drain region) of the transistor, whereas the bottom electrode 226 of the second memory device 260 may be electrically coupled to one of the top electrodes 206, 208 of the first memory device 260. Alternatively, the bottom electrodes 226 of the first and second memory devices 260 may be electrically coupled to the source region and drain region of the transistor respectively. In other non-limiting examples, a semiconductor structure may include a further number of memory devices 260 arranged with one or more transistors in ways as known to those skilled in the art. In various non-limiting embodiments, for each memory device 260, a distance between each of the top electrodes 206, 208 and the substrate of the semiconductor structure may be greater than a distance between the bottom electrode 226 and the substrate. However, the semiconductor structure need not include a transistor and may include other types of further devices in alternative non-limiting embodiments. In addition, the memory device 260 need not be part of a semiconductor structure including a substrate and may instead be used in other applications in alternative non-limiting embodiments.

The memory device 260 need not include both the top electrodes 206, 208. The memory device 260 also need not include both the switching elements 218, 220. In various alternative non-limiting embodiments, the memory device 260 may include only one of the top electrodes 206 or 208 and one of the switching elements 218 or 220, together with the bottom electrode 226. In other words, such a memory device 260 may include a bottom electrode 226, a switching element 218/220 arranged over the bottom electrode 226, a top electrode 206/208 arranged over the switching element 218/220, wherein the switching element 218/220 may have a resistance configured to switch between a first resistance value and a second resistance value in response to a change in voltage applied between the top electrode 206/208 and the bottom electrode 226. An area of a surface of the top electrode 206/208 in contact with the switching element 218/220 may be greater than an area of a surface of the bottom electrode 226 in contact with the switching element 218/220. In various non-limiting embodiments, a method for fabricating such a memory device 260 may include forming the bottom electrode 226, forming the switching element 218/220 over the bottom electrode 226, and forming the top electrode 206/208 over the switching element 218/220. The bottom electrode 226 may be formed prior to forming the top electrode 206/208.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory device comprising:
a bottom electrode;
a first switching element and a second switching element arranged over the bottom electrode;
a first top electrode arranged over the first switching element, wherein the first top electrode comprises a first contact surface in contact with the first switching element;
a second top electrode arranged over the second switching element, wherein the second top electrode comprises a second contact surface in contact with the second switching element;
wherein the first switching element has a resistance configured to switch between a first resistance value and a second resistance value in response to a change in voltage applied between the first top electrode and the bottom electrode, and wherein the second switching element has a resistance configured to switch between a third resistance value and a fourth resistance value in response to a change in voltage applied between the second top electrode and the bottom electrode;

wherein the bottom electrode comprises at least one conductive layer having a third contact surface in contact with the first switching element and a fourth contact surface in contact with the second switching element; and wherein an area of the first contact surface is greater than an area of the third contact surface, and wherein an area of the second contact surface is greater than an area of the fourth contact surface.

2. The memory device according to claim 1, wherein a width of each of the third contact surface and the fourth contact surface is less than 10 nm.

3. The memory device according to claim 1, wherein the third contact surface of the bottom electrode is arranged in a middle section of the first switching element and wherein the fourth contact surface of the bottom electrode is arranged in a middle section of the second switching element.

4. The memory device according to claim 1, wherein the first contact surface of the top electrode has a first edge and a second edge, and the third contact surface of the bottom electrode has a first edge and a second edge substantially parallel to the first edge and the second edge of the first contact surface of the top electrode respectively; and
wherein a distance between the first edges is greater than a distance between the second edges.

5. The memory device according to claim 1, wherein the memory device further comprises:
a first insulating element arranged at least partially below each of the first and second switching elements;
a second insulating element arranged adjacent to the first insulating element and at least partially below each of the first and second switching elements; and
wherein the at least one conductive layer is arranged between the first insulating element and the second insulating element.

6. The memory device according to claim 5, wherein the first insulating element comprises a gap and the bottom electrode is arranged within the gap of the first insulating element; and wherein the bottom electrode comprises a recess and the second insulating element is arranged within the recess of the bottom electrode.

7. A memory cell comprising a plurality of memory devices, each memory device comprising:
a bottom electrode;
a first switching element and a second switching element arranged over the bottom electrode;
a first top electrode arranged over the first switching element, wherein the first top electrode comprises a first contact surface in contact with the first switching element;
a second top electrode arranged over the second switching element, wherein the second top electrode comprises a second contact surface in contact with the second switching element;
wherein the first switching element has a resistance configured to switch between a first resistance value and a second resistance value in response to a change in voltage applied between the first top electrode and the bottom electrode, and wherein the second switching element has a resistance configured to switch between a third resistance value and a fourth resistance value in response to a change in voltage applied between the second top electrode and the bottom electrode;
wherein the bottom electrode comprises at least one conductive layer having a third contact surface in contact with the first switching element and a fourth contact surface in contact with the second switching element; and wherein an area of the first contact surface is greater than an area of the third contact surface, and wherein an area of the second contact surface is greater than an area of the fourth contact surface.

8. The memory cell according to claim 7, wherein for one or more of the memory devices, a width of each of the third contact surface and the fourth contact surface is less than 10 nm.

9. The memory cell according to claim 7, wherein for one or more of the memory devices, the third contact surface of the bottom electrode is arranged in a middle section of the first switching element, and wherein the fourth contact surface of the bottom electrode is arranged in a middle section of the second switching element.

10. The memory cell according to claim 7, wherein for one or more of the memory devices, the first contact surface of the top electrode has a first edge and a second edge, and the third contact surface of the bottom electrode has a first edge and a second edge substantially parallel to the first edge and the second edge of the first contact surface of the top electrode respectively; and
wherein a distance between the first edges is greater than a distance between the second edges.

11. The memory cell according to claim 7, wherein for one or more of the memory devices, the memory device further comprises:
a first insulating element arranged at least partially below each of the first and second switching elements;
a second insulating element arranged adjacent to the first insulating element and at least partially below each of the first and second switching elements; and
wherein the at least one conductive layer is arranged between the first insulating element and the second insulating element.

12. The memory device according to claim 6, wherein the bottom electrode lines an inner surface of the gap of the first insulating element.

13. The memory device according to claim 6, wherein the recess of the bottom electrode comprises a first side surface under and substantially perpendicular to the first switching element, and a second side surface under and substantially perpendicular to the second switching element.

14. The memory device according to claim 13, wherein the recess of the bottom electrode further comprises a bottom surface joining the first side surface and the second side surface, wherein the bottom surface is substantially perpendicular to the first side surface and the second side surface.

15. The memory device according to claim 6, wherein a depth of the recess of the bottom electrode ranges from about 10 nm to about 900 nm.

16. The memory device according to claim 1, wherein both a length and a width of the first switching element are greater than a length and a width of the third contact surface, and both a length and a width of the second switching element are greater than a length and a width of the fourth contact surface.

17. The memory cell according to claim 11, wherein the memory cell further comprises a plurality of bit lines, and wherein for each of the one or more of the memory devices, the second insulating element is arranged over a respective one of the plurality of bit lines, and the at least one conductive layer is further arranged between the second insulating element and the respective one of the plurality of bit lines.

* * * * *